(12) United States Patent
Dupuis et al.

(10) Patent No.: US 6,362,606 B1
(45) Date of Patent: Mar. 26, 2002

(54) METHOD AND APPARATUS FOR REGULATING A VOLTAGE

(75) Inventors: Timothy J. Dupuis; Susanne A. Paul, both of Austin, TX (US)

(73) Assignee: Silicon Laboratories, INC, Austin, TX (US)

(*) Notice: Subject to any disclaimer, the term of this patent is extended or adjusted under 35 U.S.C. 154(b) by 0 days.

(21) Appl. No.: 09/659,876

(22) Filed: Sep. 12, 2000

(51) Int. Cl.[7] .............................................. G05F 1/40
(52) U.S. Cl. ...................................... 323/272; 323/369
(58) Field of Search ................................. 323/272, 369, 323/271, 283

(56) References Cited

U.S. PATENT DOCUMENTS

| | | |
|---|---|---|
| 4,772,856 A | 9/1988 | Nojima et al. |
| 4,808,907 A * | 2/1989 | Main ........................... 323/316 |
| 4,893,030 A * | 1/1990 | Shearer et al. ............... 323/315 |
| 5,023,566 A | 6/1991 | El-Hamamsy et al. |
| 5,118,997 A | 6/1992 | El-Hamamsy et al. |
| 5,274,341 A | 12/1993 | Sekine et al. |
| 5,291,123 A * | 3/1994 | Brown ......................... 323/369 |
| 5,327,337 A | 7/1994 | Cripe |
| 5,343,162 A | 8/1994 | Davis |
| 5,612,647 A | 3/1997 | Malec |
| 5,623,231 A | 4/1997 | Mohwinkel et al. |
| 5,648,743 A | 7/1997 | Nagaya et al. |
| 5,867,061 A | 2/1999 | Rabjohn et al. |
| 5,880,635 A | 3/1999 | Satoh |
| 5,942,946 A | 8/1999 | Su et al. |
| 5,955,926 A | 9/1999 | Uda et al. |
| 5,969,582 A | 10/1999 | Boesch et al. |
| 5,974,041 A | 10/1999 | Kornfeld et al. |
| 6,137,273 A * | 10/2000 | Bales et al. .................. 323/296 |
| 6,167,134 A | 12/2000 | Scott et al. |
| 6,181,207 B1 | 1/2001 | Chevallier et al. |

OTHER PUBLICATIONS

Sokal, N. O. and Sokal, A. D., "Class E –A new class of high–efficiency tuned single ended switching power amplifiers," IEEE Journal of Solid State Circuits, vol. SC–10, No. 3, Jun. 1975, pp. 168–176.

Makihara, Chihiro et al., "The Possibility of High Frequency Functional Ceramics Substrate", International Symposium on Mulilayer Electronic Ceramic Devices, May 5, 1998 in Cincinnati, Ohio.

* cited by examiner

*Primary Examiner*—Shawn Riley
(74) *Attorney, Agent, or Firm*—Johnson & Associates (57) ABSTRACT

An RF power amplifier is provided for use with wireless transmission systems such as cellular phones. An RF power amplifier includes direct drive amplifier circuitry operating in a push-pull scheme. The RF power amplifier includes a pair of switching devices driven by a pair of mutually coupled inductive devices. The inductive devices may be magnetically or capacitively coupled together. The RF power amplifier may be formed on a single integrated circuit and include an on-chip bypass capacitor. The RF power amplifier may utilize a voltage regulator for providing a regulated voltage source. The RF power amplifier may be provided using a dual oxide gate device resulting in an improved amplifier. The RF power amplifier may be packaged using flip chip technology and multi-layer ceramic chip carrier technology.

23 Claims, 8 Drawing Sheets

METHOD AND APPARATUS FOR REGULATING A VOLTAGE

The following U. S. patent applications, each filed on Sep. 12, 2000: Ser. No. 09/660,009, entitled "RF Power Amplifier Circuitry and Method for Amplifying RF Signals" by Timothy J. Dupuis et al (pending); Ser. No. 09/659,636, entitled "Dual Oxide Gate Device and Method for Providing the Same" by Timothy J. Dupuis et al (pending); Ser. No. 09/659,874, entitled "RF Power Amplifier Device and Method for Packaging the Same" by Timothy J. Dupuis et al (pending); Ser. No. 09/660,123, entitled "Power Amplifier Circuitry and Method" by Susanne A. Paul et al (pending); and Ser. No. 09/659,873, entitled "Apparatus and Method for Providing Differential-to-Single Ended Output Conversion and Impedance Transformation" by Susanne A. Paul et al (pending), are expressly incorporated herein by reference.

TECHNICAL FIELD OF THE INVENTION

This invention relates to the field of voltage regulators. More particularly, this invention relates to a voltage regulator which improves power dissipation.

BACKGROUND

Some prior art RF power amplifiers use two active switching devices to generate a square wave signal. An output load network filters and transforms the signal into a sinusoidal output signal which is then transmitted. There are various problems associated with this type of power amplifier. Perhaps the largest problem with power amplifiers involves the efficiency of the amplifiers. When RF power amplifiers are used to produce high power signals, such as with transmitters, it is desired to have efficient amplifiers in order to conserve power and adequately dissipate heat. This problem is especially hard to overcome in designs utilizing CMOS devices.

Another problem relates to the use of an isolation transformer. Some prior art RF power amplifiers include a transformer connected between the pre-driver circuitry and the amplifier circuit. This presents various issues. First, a transformer is required, which uses valuable real estate on a printed circuit board (PCB) and also increases the cost of the amplifier. In addition, the transformer consumes power and generates heat.

Another problem with prior art power amplifiers involves voltage regulators. During battery charge up, the battery voltage can be much higher than the steady-state voltage. Applying this high voltage directly to a CMOS power amplifier can cause breakdown problems. Therefore, a voltage regulator may be required to provide a regulated voltage source. However, when the battery charge is high and the power amplifier is transmitting at maximum power, there is a high power dissipation in the voltage regulator which could exceed the package power rating of an integrated circuit.

When selecting the types of devices to be used in a CMOS design, such as an RF power amplifier, certain tradeoffs exist. For example, devices with smaller gate oxide thickness are faster and take up less space. However, as the gate oxide thickness gets smaller, the breakdown voltage of the device also gets smaller. Therefore, when selecting devices in a CMOS design a problem develops in getting a suitable breakdown voltage as well as a suitable speed for a device.

Another problem with prior art power amplifiers relates to amplifiers using a push-pull architecture. A push-pull architecture requires very low inductance and resistance in the ground and signal connections of the integrated circuit to the PCB. In a typical wire bond package, the bond wire inductance can be large enough to cause problems. In addition, the resistance of on-chip wiring using thin on-chip conductors can cause significant losses.

SUMMARY OF THE INVENTION

A voltage regulator of the present invention provides a regulated voltage to a device residing on an integrated circuit, the voltage regulator including a first regulator coupled between a voltage source and the power amplifier, the first regulator residing on the integrated circuit, a second regulator coupled between the voltage source and the power amplifier, the second regulator residing on the integrated circuit, and an external resistor coupled between the second regulator and the voltage source for dissipating power outside the integrated circuit.

Another embodiment of the invention provides a voltage regulator for providing a regulated voltage to an integrated circuit on which the voltage regulator resides, the voltage regulator comprising a regulator circuit coupled to a voltage source, and an external resistor coupled to the regulator circuit for dissipating power outside the integrated circuit.

Another embodiment of the invention provides a method of providing a regulated a voltage from a voltage source comprising the steps of providing a first regulator circuit coupled to the voltage source, providing a second regulator circuit coupled to the voltage source, and connecting a resistance between the second regulator circuit and the voltage source.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
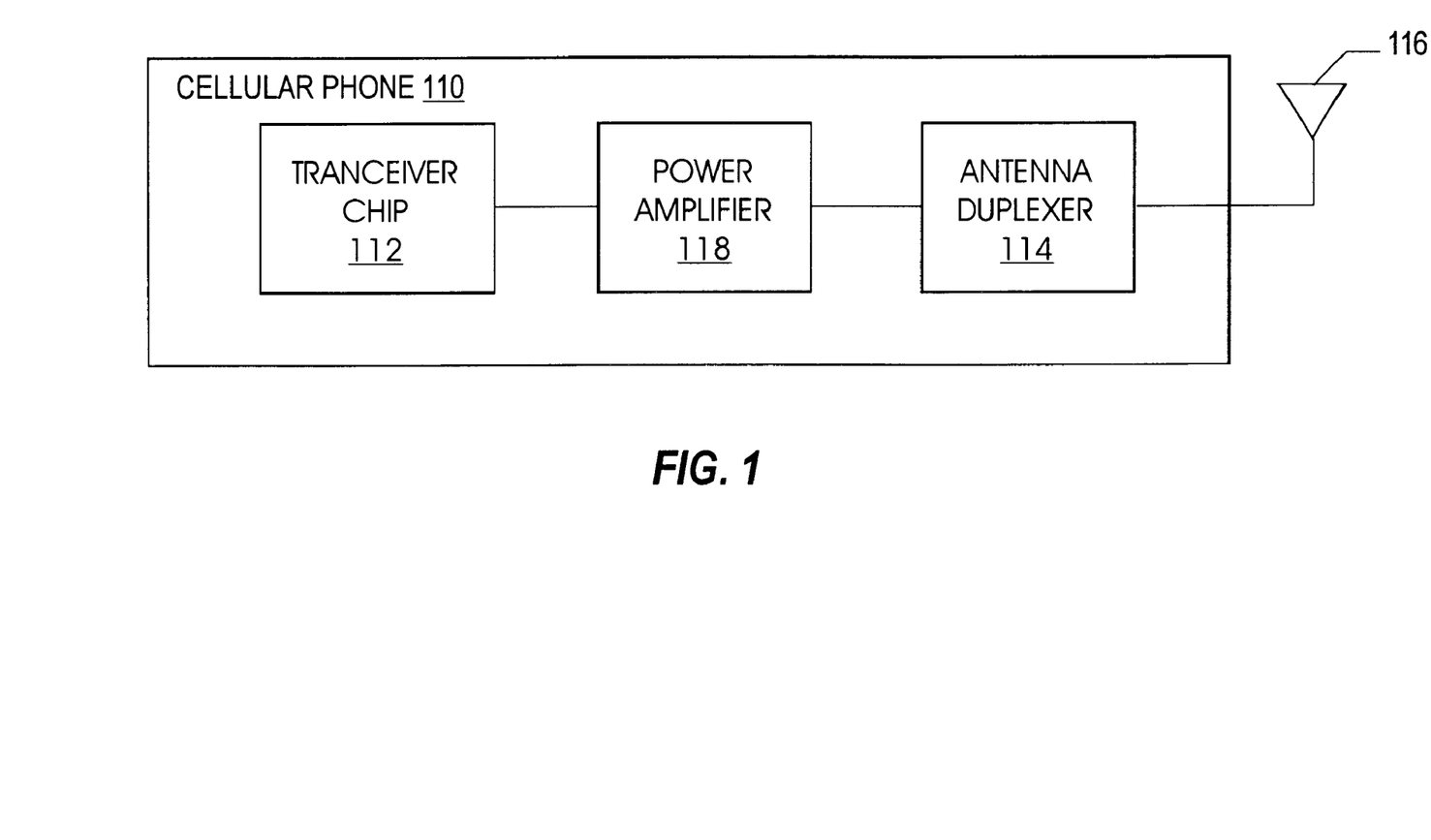
FIG. 1 is a block diagram of a cellular telephone system illustrating a typical application of the present invention.

In order to provide a context for understanding this description, FIG. 1 illustrates a typical application of the present invention. It should be understood that the present invention, can be used in applications and environments other than that shown as an example in the figures. FIG. 1 shows a cellular telephone 110 including a transceiver chip 112, an antenna duplexer 114, and an antenna 116. Connected between the transceiver chip 112 and the antenna duplexer 114 is an RF power amplifier 118. For clarity, other components of the cellular phone 110 are not shown.

The RF power amplifier 118 is preferably a non-linear power amplifier used in communication schemes that utilize frequency shift keying (FSK) or phase shift keying (PSK) such as GSM systems. However, the RF power amplifier 118 may also be used with other communication schemes. When the cellular phone 110 transmits data, the transceiver chip 112 creates an RF signal which is amplified by the RF power amplifier 118 to a level desired for transmission. The amplified output of the RF power amplifier 118 is provided to the load which is typically a 50 ohm load. The load shown in FIG. 1 is comprised of the antenna duplexer 114 and antenna 116.

Figure 2:
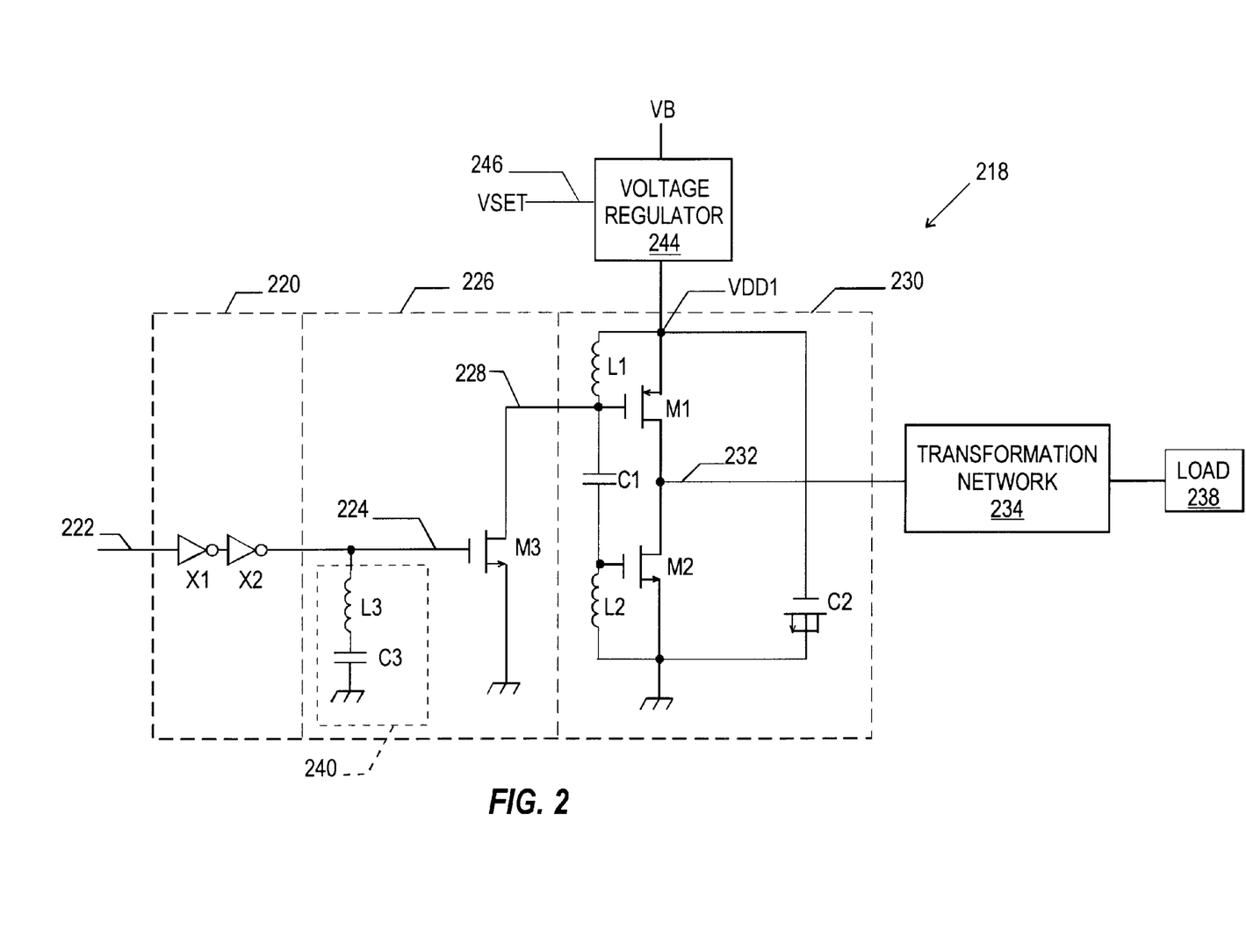
FIG. 2 is a schematic diagram of an RF power amplifier according to a preferred embodiment of the present invention.

FIG. 2 is a schematic diagram illustrating an RF power amplifier 218 of the present invention. The RF power amplifier 218 can be divided into three portions: an input buffer circuit 220, a driver circuit 226 and a push-pull amplifier circuit 230. In general, the input buffer circuit 220 receives an RF input signal and provides a buffered signal to the driver circuit 226 which drives the amplifier circuit 230 in order to amplify the signal. In a preferred embodiment, the RF power amplifier 218 shown in FIG. 2 is formed in a single integrated circuit.

The input buffer circuit 220 has an input 222 connected to a 50 ohm input network (e.g., the transceiver chip 112 shown in FIG. 1). The input buffer circuit 220 is comprised of a series of inverters X1 and X2. The input buffer circuit 220 could also be comprised of more or less inverters, or any other suitable circuitry. The output of the buffer circuit 220 is connected to the input 224 of the driver circuit 226. The driver circuit 226 is comprised of an n-channel switching device M3. The switching device M3 is connected as shown to the input 224 and to ground.

The output of the driver circuit 226 is connected to the input 228 of the push-pull amplifier circuit 230. The amplifier circuit 230 is comprised of first p-channel switching device M1 and a second n-channel switching device M2 connected in series between a voltage source VDD1 and ground. Preferably, the switching devices M1, M2, and M3 are comprised of MOSFETS. The switching devices M1 and M2 are driven by inductors L1 and L2, respectively. Inductors L1 and L2 are capacitively coupled together such that the switching devices M1 and M2 are alternately turned on and off. The gate of the switching device M1 is connected to the driver circuit 226 via input 228. The amplifier circuit 230 also includes bypass capacitor C2 (described in detail below).

As shown in FIG. 2, an output node 232 is formed between the switching devices M1 and M2. The output node 232 is connected to a passive transformation network 234, which drives a load 238. The load 238 may be comprised of an antenna duplexer and an antenna such as that shown in FIG. 1. The voltage source VDD1 is provided by a voltage regulator 244. The voltage regulator 244 is connected to a control signal at input 246 and to a battery voltage source VB to provide the amplifier circuit 230 with a regulated voltage source. The voltage regulator 244 is described in detail below. The function of the transformation network 234 is to convert a low voltage signal (approximately 3.5 volts) into a high voltage signal (approximately ±15 volts). The transformation network 234 is comprised of all passive components including inductors and capacitors.

Figure 3:
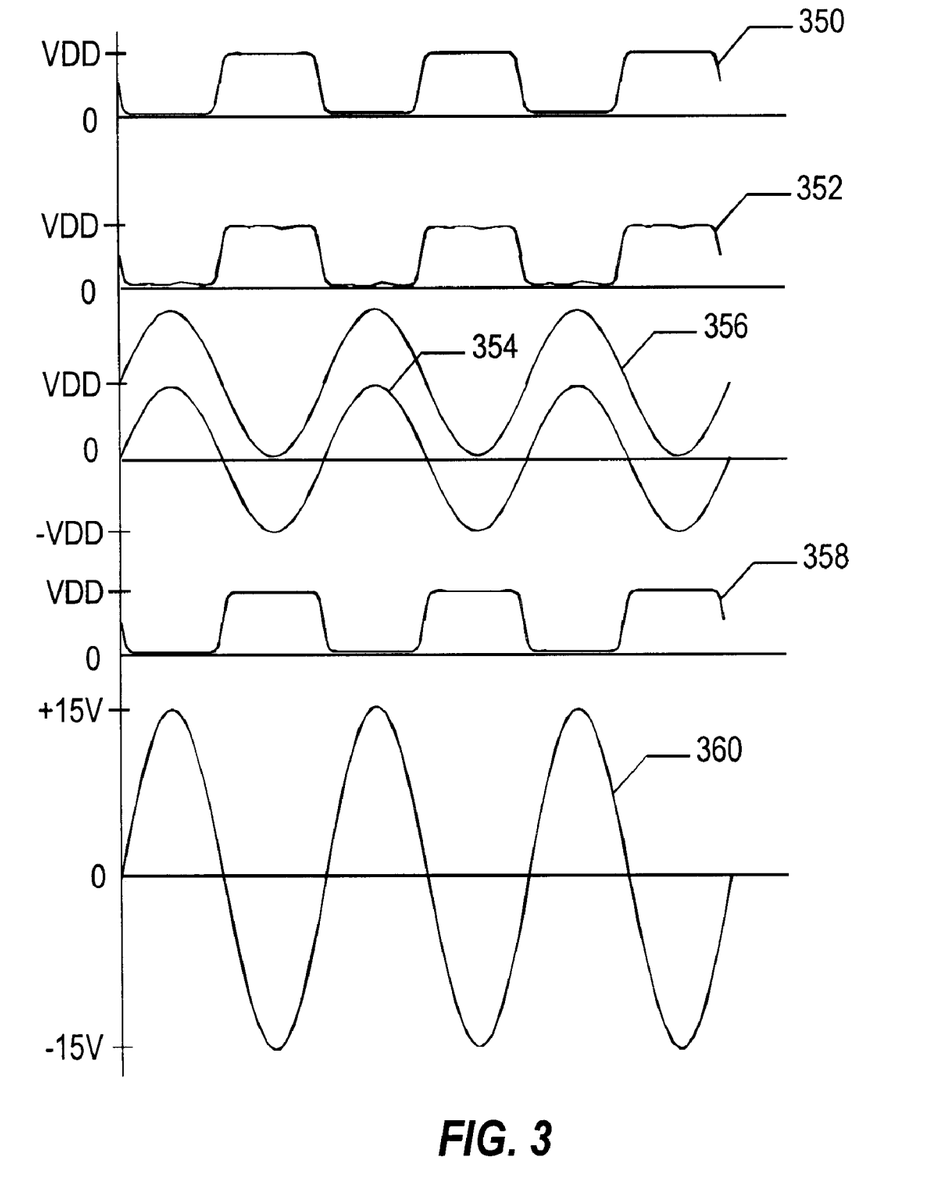
FIG. 3 is a diagram illustrating the signals present at various nodes of the RF power amplifier of the present invention.

FIG. 3 is a diagram illustrating the signals present at various nodes of the RF power amplifier 218 shown in FIG. 2. The first signal 350 illustrates the signal present at the input 222 of the buffer circuit 220. As mentioned above, the signal 350 may come from an RF transceiver chip or similar device. The signal 350 is a square wave at the carrier frequency and with an amplitude between VDD and ground. When a device such as cell phone 110 (FIG. 1) transmits data, the frequency of signal 350 varies over a narrow band of about ±200 kHz around the carrier frequency (for example, 900 MHz or 1.8 GHz). In other words, the frequency of the square wave signal 350 changes slightly over time in order to modulate the digital information onto the carrier signal.

The signal 350 gets buffered by the buffer circuit 220 to where it can drive the switching device M3 of the driver circuit 226. The second signal 352 in FIG. 3 illustrates the buffered signal present at input 224 of the driver circuit 226. The switching device M3 of the driver circuit 226 shown in FIG. 2 is an n-channel transistor that provides current pulses to the amplifier circuit 230 in response to the signal 352 at its input 224. FIG. 2 also shows optional circuitry 240. In an embodiment using optional circuitry 240, the driver circuit 226 is comprised of an inductor L3, a capacitor C3, and the p-channel switching device M3. The inductor L3 and capacitor C3 are connected in series between the input 224 and ground. With inductor L3 and capacitor C3, the components of the driver circuit 226 form a resonant network, which is tuned to resonate at $\omega_O$ (the center band frequency). This resonant network assists in driving the input capacitance of switching device M3.

The switching device M3 drives the gate of switching device M1 (via input node 228) to a sine wave as illustrated by signal 354 in FIG. 3. The signal 354 is a sine wave with peaks between VDD and −VDD. As mentioned above, inductor L1 is capacitively coupled to inductor L2 so that the gate of switching device M2 is driven by a sine wave illustrated by signal 356 in FIG. 3. With the switching devices M1 and M2 driven by signals 354 and 356, the switching devices M1 and M2 act as a push-pull amplifier to drive the output node 232 to a square wave between VDD and ground, as illustrated by signal 358 in FIG. 3. The signal 358 present at node 232 is filtered and transformed by the transformation network 234 to drive the load 238 with a high-voltage sine wave illustrated by signal 360 in FIG. 3. The transformation network 234 is designed to provide an output signal having a desired amplitude, for example, ±15 volts.

In the preferred embodiment of the present invention, the load, as seen by the driver circuit 226 is a tuned circuit formed by inductor L1 and the parasitic capacitance of the switching device M1. Since the switching device M1 has a high input gate capacitance, it can be hard to drive the switching device M1. Therefore, the inductance of inductor L1 is chosen to tune out this parasitic capacitance.

The switching device M3, inductor L1, and switching device M1 operate as a "Class A" or a "Class C" amplifier to drive the gate of switching device M1. When tuned properly, the signals present at the gates of switching devices M1 and M2 will be sine waves (signals 354 and 356 in FIG. 3). The amplifier circuit 230 is tuned to a desired frequency, which depends on the particular application of the RF power amplifier 218. For example, in a cellular telephone environment, the amplifier circuit 230 may be tuned to 900 MHz or 1.8 GHz.

One important feature of the RF power amplifier 218 is that the switching devices M1 and M2 operate in a substantially non-overlapping manner. In other words, switching device M1 turns off before switching device M2 turns on, and vice versa. Another important feature of the RF power amplifier 218 is that the amplifier circuit 230 is driven directly by the driver circuit 226, as opposed to going through an isolation transformer. Thus, the amplifier is referred to as being a "direct drive" amplifier.

As mentioned above, the amplifier circuit 230 shown in FIG. 2 includes a bypass capacitor C2. The bypass capacitor C2 is connected in parallel with the switching devices M1 and M2. In the preferred embodiment, the capacitor C2 is formed by a transistor with the source and drain tied together. In addition, the capacitor C2 is formed on the same integrated circuit as the amplifier circuit 230. Since the amplifier circuit 230 must provide the load with a lot of power (e.g., 2 watts at ±15 volts), the current through switching devices M1 and M2 will be very high (e.g., ±2 amps). As a result, the circuit cannot tolerate any parasitic inductance in this loop. By forming the bypass capacitor C2 on the semiconductor chip near the switching devices M1 and M2, this loop is kept very tight.

Figure 4:
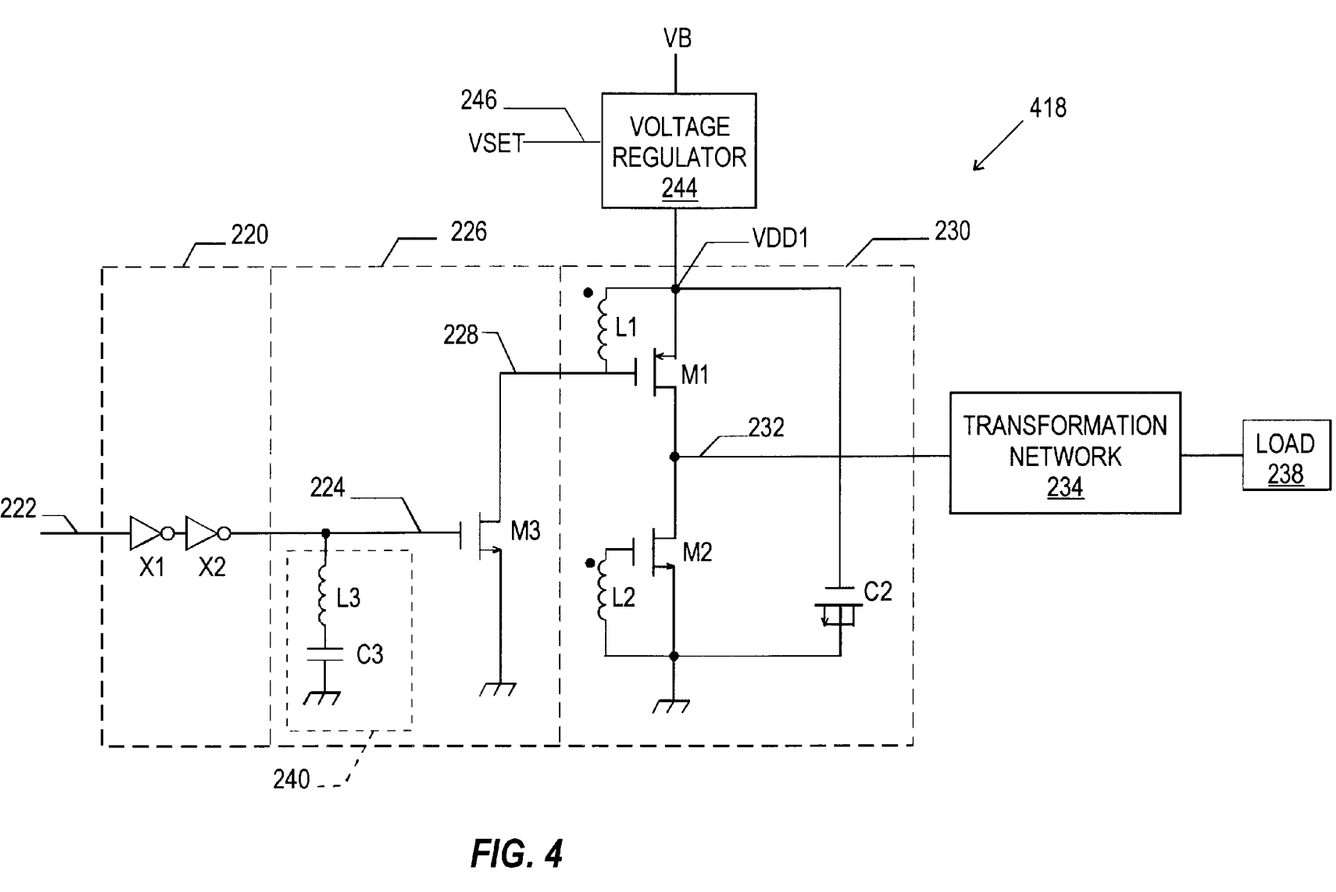
FIG. 4 is a schematic diagram of an alternate embodiment of a power amplifier of the present invention.

FIG. 4 is a schematic diagram of another embodiment of an RF amplifier of the present invention. FIG. 4 is a schematic diagram illustrating an RF power amplifier 418. The amplifier 418 is similar to the amplifier 218 shown in FIG. 2 except that the inductors L1 and L2 which drive the switching devices M1 and M2 are magnetically coupled together.

The amplifier circuit 230 shown in FIG. 4 is comprised of first p-channel switching device M1 and a second n-channel switching device M2 connected in series between a voltage source VDD1 and ground. The switching devices M1 and M2 are driven by inductors L1 and L2, respectively. Inductors L1 and L2 are magnetically coupled together such that the switching devices M1 and M2 are alternately turned on and off. The switching device M3 drives the gate of the switching device M1 to a sine wave. The inductor L1 is magnetically coupled to inductor L2 so that the gate of switching device M2 is driven by an in phase sine wave. In one embodiment, the inductors L1 and L2 shown in FIG. 4 are formed by conductive loops positioned proximate each other such that the current through one inductor induces current in the other inductor. The remainder of the amplifier 418 operates in a manner similar to the amplifier 218 shown in FIG. 2.

As mentioned above, the RF power amplifier shown in FIG. 1 includes a voltage regulator 244 connected between the amplifier circuit 230 and a source of battery voltage VB to provide a voltage source VDD1. In the preferred embodiment of the present invention, the voltage regulator 244 resides on the same integrated circuit as the power amplifier circuit. The function of the voltage regulator is to provide a source of voltage to the power amplifier and to help control the output power level. For example, in a cellular phone environment, a base station may dictate the power level at which each cell phone should transmit (based on factors such as the physical distance from the base station, for example). Varying the voltage level (VDD1) can control the output power of the power amplifier. As the voltage of the voltage source VDD1 increases, the output power increases. Therefore, by controlling the operation of the voltage regulator, and therefore controlling the voltage of voltage source VDD1, the output power of the amplifier can be controlled. While the RF amplifier 218 will function with any suitable voltage regulator or voltage source, described below is a detailed description of a suitable voltage regulator.

Figure 5:
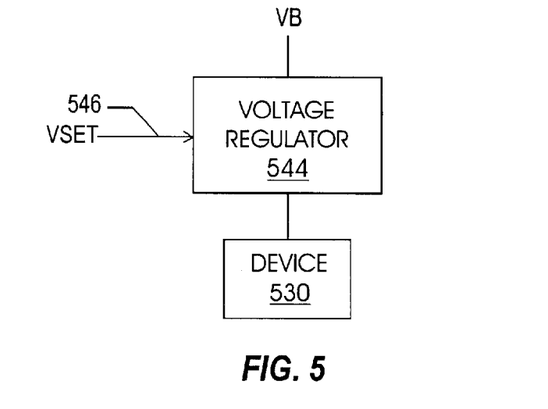
FIG. 5 is a block diagram of a voltage regulator of the present invention.

FIG. 5 is a block diagram of a voltage regulator 544 used to provide a regulated voltage VDD from a voltage source VB, for example, from a battery. As shown, the regulated voltage VDD is provided to a device 530. The device 530 may be any type of device requiring a voltage source including, but not limited to power amplifiers. The voltage regulator 544 includes an input 546 that is connected to a control signal VSET to control the voltage level VDD provided to the device 530. Following is a detailed description of the voltage regulator of the present invention in the context of its use in an RF power amplifier (such as that shown in FIG. 2). However, it is understood that the voltage regulator may be used with any type of amplifier as well as any other type of device requiring a voltage source.

Figure 6:
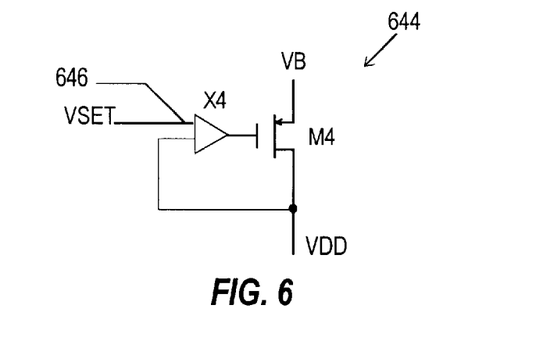
FIG. 6 is a schematic diagram of an embodiment of a voltage regulator of the present invention.

FIG. 6 is a schematic diagram of a first embodiment of a voltage regulator 644 connected to a battery voltage VB. The voltage regulator 644 is comprised of a device M4 and an op amp X4. The op amp X4 includes a first input 646 for connection to a voltage control signal VSET. In a preferred embodiment, the control signal VSET is an analog voltage signal that is proportional to the desired voltage level. The other input to the op amp X4 is connected to the regulated voltage VDD. The output of the op amp X4 is connected to the base of the device M4.

Figure 7:
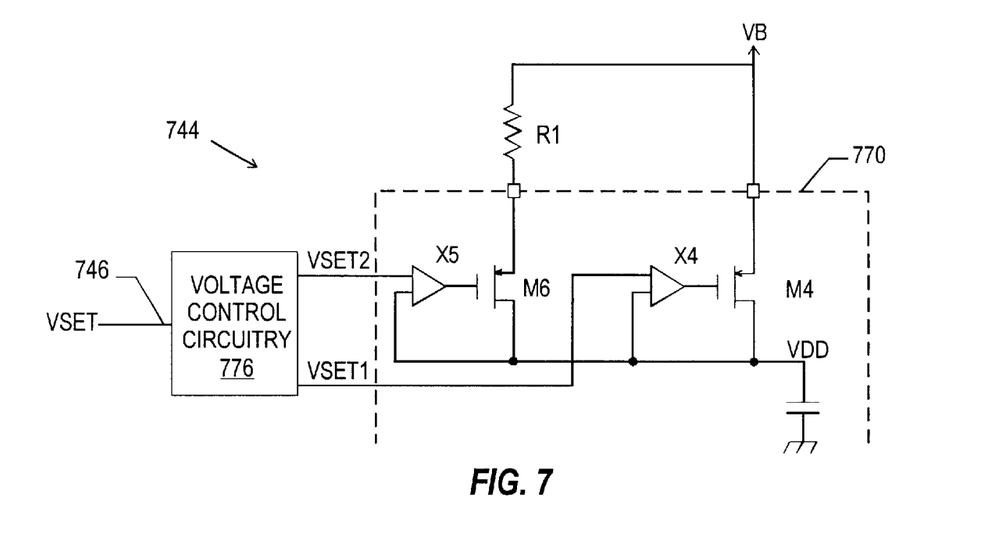
FIG. 7 is a schematic diagram of an embodiment of a voltage regulator of the present invention.

FIG. 7 is a schematic diagram of another embodiment of a voltage regulator 744 connected to a battery voltage VB. The voltage regulator 744 is similar to the voltage regulator 644 shown in FIG. 6 with the addition of a second regulator circuit comprised of op amp X5, switching device M6, and an external resistor R1. FIG. 7 also shows an integrated circuit 770 (dashed lines) to illustrate that the power amplifier is formed on the integrated circuit 770 while the resistor RI is not. The integrated circuit 770 may also be the same integrated circuit on which the device to be powered resides.

The first regulator circuit is connected in the same manner as the regulator circuit shown in FIG. 6. The op amp X5 of the second regulator circuit includes an input VSET2 for connection to a voltage control signal. The other input to the op amp X5 is connected to the regulated voltage VDD. The output of the op amp X5 is connected to the gate of the device M6. The external resistor R1 is connected between the battery voltage VB and the device M6. FIG. 7 also shows voltage control circuitry 776 which has an input 746 connected to the control signal VSET. The voltage control circuitry 776 uses the signal VSET to create voltage control signals VSET1 and VSET2 for use by the first and second regulator circuits. By controlling both regulators, the voltage level VDD can be controlled. In addition, by selectively activating the second regulator, power can be dissipated off the integrated circuit 770 (via resistor R1). This results in a reduction of heat generated in the integrated circuit 770.

The voltage regulator 744 operates as follows. Since it is desired to minimize the amount of power dissipated on the integrated circuit 770, one goal is to maximize the use of the second regulator circuit (X5, M6) in order to maximize power dissipation through the external resistor R1. Therefore, voltage control circuitry 776 will enable the second regulator circuit to provide as much power as it can before enabling the first regulator circuit (X4, M4). In other words, when more power is required than the second regulator circuit can provide, the first regulator circuit is enabled to provide additional power. In this way, the maximum amount of power will be dissipated through external resistor R1.

Figure 8:
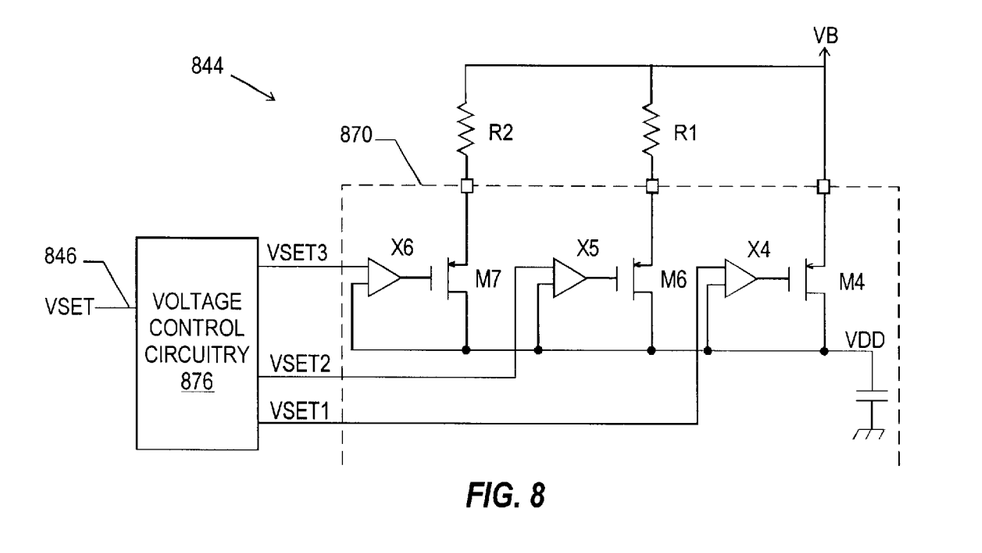
FIG. 8 is a schematic diagram of an embodiment of a voltage regulator of the present invention.

FIG. 8 is a schematic diagram of another embodiment of voltage regulator 844 having multiple regulators and multiple external resistors. The voltage regulator 844 is similar to the regulator 744 shown in FIG. 7, with the addition of a third regulator circuit comprised of device M7, op amp X6, and external resistor R2. The third regulator circuit is connected in the same ways as the second regulator circuit, and operates in a similar manner. The op amp X6 of the third regulator circuit includes an input VSET3 for connection to a voltage control signal. The other input to the op amp X5 is connected to the regulated voltage VDD. The output of the op amp X6 is connected to the gate of device M7. The external resistor R2 is connected between the batter voltage VB and device M7. FIG. 8 also shows voltage control circuitry 876 which has an input 846 connected to the control signal VSET. The voltage control circuitry 876 uses the signal VSET to create voltage control signals VSET1, VSET2, and VSET3 for use by the regulator circuits. By activating the second or third regulator, power can be dissipated off the integrated circuit 870 (via resistor R1 and/or R2). This results in a reduction of heat generated in the integrated circuit 870.

The voltage regulator 844 operates as follows. Since it is desired to minimize the amount of power dissipated on the integrated circuit 870, one goal is to maximize the use of the second and third regulator circuits in order to maximize power dissipation through the external resistors R1 and R2. Therefore, voltage control circuitry 876 will enable the second and third regulator circuits to provide as much power as it can before enabling the first regulator circuit. In other words, when more power is required than the second and/or third regulator circuit can provide, the first regulator circuit is enabled to provide additional power. In this way, the maximum amount of power will be dissipated through external resistors R1 and R2.

The values of the resistors R1 and R2 may be equal, or may be different, depending on the needs of a user. In addition, the invention is not limited to the use of one or two external resistors. Additional regulator circuits and external resistors could be added. In one embodiment, the value of resistor R1 is 0.7 ohms and the value of resistor R2 is 0.3 ohms.

Another benefit of the present invention involves the use of dual gate oxide devices. In CMOS digital systems, it is sometimes desired to provide devices suitable for use with two voltage levels (e.g., 3.3 volts and 5 volts). Therefore, processing technologies have been developed to provide a single integrated circuit having both 0.5 $\mu$m and 0.35 $\mu$m devices. As mentioned above, a thicker gate oxide results in a device with a higher breakdown voltage. On the other hand, a thinner gate oxide results in a faster device, but with a lower breakdown voltage.

The RF amplifier of the present invention takes advantage of the availability of dual gate oxide devices by selectively choosing certain gate lengths for various components of the amplifier. For example, it has been discovered that for preprocessing circuitry or pre-driver circuitry, a high speed is desirable and breakdown voltage is not as important. Therefore these devices are designed using a thinner gate oxide. For output state devices, where a high breakdown voltage is more important, the devices are designed using a thicker gate oxide.

In a preferred embodiment, a dual gate oxide device is used to create an RF amplifier such as the RF amplifier shown in FIG. 2. One suitable dual gate oxide device includes devices having channel lengths of both 0.5$\mu$m and 0.35 $\mu$m. The 0.5 $\mu$m and 0.35 $\mu$m devices have gate oxide thicknesses of 140 Angstroms (Å) and 70 Å, respectively. Referring to the example shown in FIG. 2, the inverters X1 and X2 of the input buffer circuit 220 are implemented using 0.35 $\mu$m devices since a higher breakdown voltage is not necessary. The switching devices M1, M2, M3, M4, M6, and M7 are each implemented using 0.5 $\mu$m devices since a higher breakdown voltage is desired. Table 1 is a table listing an example of possible gate lengths for the devices in the RF power amplifier shown in the Figures.

TABLE 1

| REFERENCE NO. | DEVICE | GATE OXIDE THICKNESS |
|---|---|---|
| M1 | TRANSISTOR | 140 Å |
| M2 | TRANSISTOR | 140 Å |
| M3 | TRANSISTOR | 140 Å |
| M4 | TRANSISTOR | 140 Å |
| M6 | TRANSISTOR | 140 Å |
| M7 | TRANSISTOR | 140 Å |
| C2 | CAPACITOR | 70 Å |
| X1 | INVERTER | 70 Å |
| X2 | INVERTER | 70 Å |

Of course, the present invention is not limited to just the values shown in Table 1. For example, as thinner gate oxides become more common, one or both thicknesses may become lower. In addition, note that the terms "thicker" or "thinner" in this description are intended to only refer to intentional or significant differences in gate oxide thicknesses. For example, the 0.35 $\mu$m devices may vary from one another by some small amount depending on manufacturing tolerances. A 0.5 $\mu$m device is considered to be "thicker" than a 0.35 $\mu$m device. Also note that this invention applies to various CMOS devices and that the RF Amplifier described above is only used as one example of the application of dual gate oxide devices of the present invention.

Another benefit of the present invention relates to how an RF power amplifier of the present invention is packaged. The design of an RF amplifier, such as that shown in FIG. 2, requires a low inductance and low resistance to the transistors or switching devices. In addition, CMOS designs result in a lot of parasitics which require offsetting matching networks. The packaging technique of the present invention addresses these concerns by using "flip chip" technology and multi-layer ceramic chip carrier technology.

Figure 9:
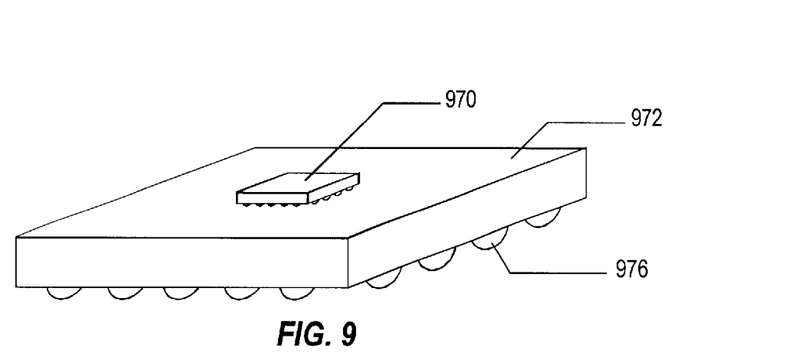
FIG. 9 is an isometric view illustrating how a device of the present invention is packaged.
Figure 10:
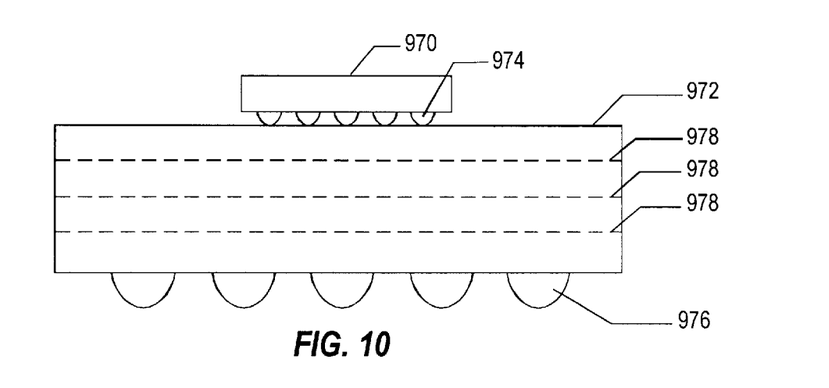
FIG. 10 is a side view of the device shown in FIG. 9.

FIGS. 9 and 10 are isometric and side views, respectively, illustrating a packaging technique of the present invention. FIGS. 9 and 10 show a "flip chip" integrated circuit 970 mounted to a multi-layer ceramic chip carrier 972. The integrated circuit 970 includes a plurality of connection points, or "bumps" 974 on the underside of the integrated circuit 970. Similarly, the ceramic chip carrier 972 includes a plurality of connection points or bumps 976. The bumps 974 of the integrated circuit 970 are formed by solder and can be mounted to corresponding conductive material formed on the upper surface of the ceramic chip carrier 972. Similarly, the bumps 976 of the ceramic chip carrier 972 are also formed by solder and are used to mount the chip carrier 972 to a printed circuit board (not shown). A typical flip chip allows 250 $\mu$m spaced bumps. A typical chip carrier also allows 250 $\mu$m spaced vias for connection to the flip chip bumps 974. In one example, 6×6 mm ceramic chip carrier includes 36 bumps 976 for connection to a PCB. Flip chip and ceramic chip carrier technologies are considered conventional and will not be described in detail.

Various benefits can be realized by selectively placing certain components of the RF power amplifier of the present invention on integrated circuit 970 and ceramic chip carrier 972. The invention will be described with respect to the RF power amplifier shown in FIG. 2, although the invention is not limited to the circuit shown in FIG. 2. In one embodiment of the invention, all of the switching devices are formed on the integrated circuit 970. In addition, the power transistors (such as switching devices M1, M2 and M3) formed on the integrated circuit 970 are preferably placed directly below the bumps 974 of the integrated circuit 970 resulting in low resistance and inductance (as compared to wire bond integrated circuit packages).

The multi-layer ceramic chip carrier 972 is used to build high-Q inductors, transformers, and capacitors. This can be beneficial for CMOS power amplifier architecture since the high gate capacitance (low $f_T$) of CMOS power FETs requires the FET to be split into multiple units with separate matching transformers. For example, a single band power amplifier may require 4–8 inductors which would be impractical to build on a printed circuit board. In addition, multiple matching networks are used to provide the high transformation ratio required in a push-pull amplifier design. In one embodiment of the invention, the transformers, inductors, capacitors, and other passive devices are formed on the ceramic chip carrier 972. The ceramic chip carrier 972 includes multiple conductive layers 978 (shown as hidden lines) that can be designed to implement these passive devices.

In one embodiment of the RF power amplifier shown in FIG. 2, the switching devices M1, M2, M3, capacitors C1, C2, and inverters X1 and X2 reside on the integrated circuit 970, with the inductors L1, L2, and transformation network 234 residing on the multi-layer ceramic chip carrier 972.

Figure 11:
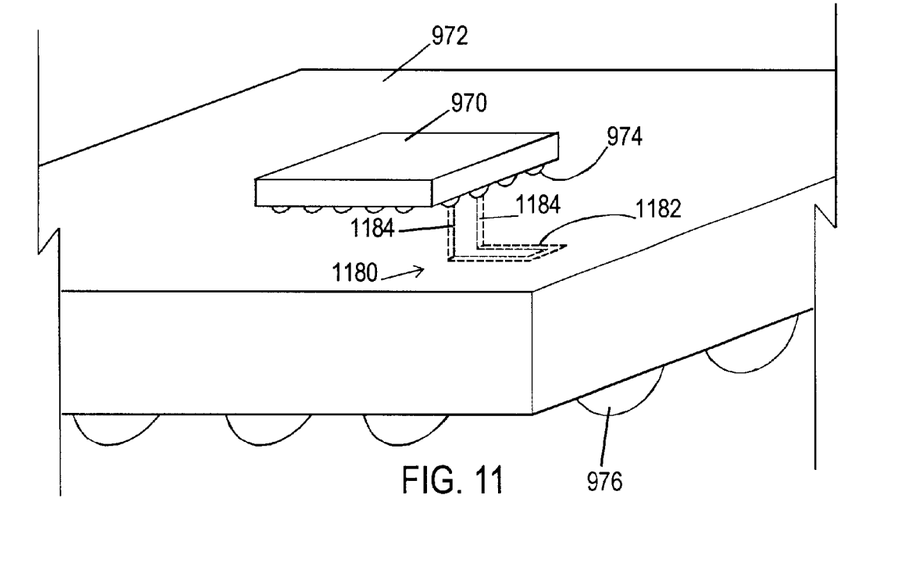
FIG. 11 is a diagram illustrating a ceramic chip carrier with an inductor formed in the carrier.

In a CMOS power amplifier design, multiple high-Q inductors are required to tune out large on-chip gate capacitances. Since these capacitances are large, the required inductors are low in value and difficult to integrate. One solution is to form high-Q inductors on the ceramic chip carrier. FIG. 11 is a diagram illustrating the ceramic chip carrier 972 shown in FIGS. 9 and 10 with a horizontally-formed inductor 1180 formed in the ceramic chip carrier 972. The inductor 1180 includes a horizontal loop portion formed by conductive tracel 182 connected to two bumps 974 of the ceramic chip carrier 972 by two vias 1184. One disadvantage with the inductor 1180 is that the inductor connection points needs to be close to the edge of the ceramic chip carrier 972 unless the value of the inductor is large enough to route to a lower layer of the ceramic chip carrier 972.

Figure 12:
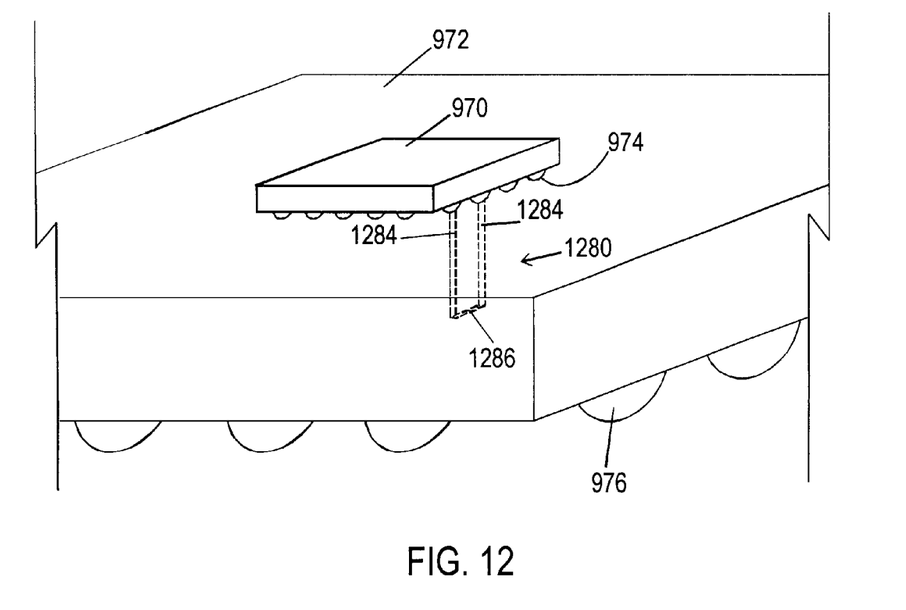
FIG. 12 is a diagram illustrating a ceramic chip carrier with a vertically-formed inductor formed in the carrier.

FIG. 12 is a diagram illustrating the ceramic chip carrier 972 with a vertically-formed inductor 1280 formed in the carrier 972. The inductor 1280 is formed in the vertical direction by vias 1284 extending to conductive trace 1286, which may be formed on a lower level of the carrier 972. As shown, the inductor 1280 extends downward into the ceramic chip carrier 972 and is coplanar, since the vias 1284 and trace 1286 exist on the same plane. The vias 1284 may be formed through several layers of the carrier 972, depending the inductance desired. A vertically-formed inductor such as the inductor 1280 has two major advantages over horizontally-formed inductors. First, the vertically-formed inductors can be formed underneath the chip 970 without blocking other routing channels. Therefore, more layout options are available, and more inductors can be formed. Second, the vertically-formed vias 1284, as opposed to the horizontal conductive trace 1182, result in less loss at RF frequencies since the vias 1284 have a greater cross-sectional surface area than the conductive traces. The vias 1284 are substantially cylindrical and have a surface area of $\pi dL$, where d is the diameter of the via 1284 (e.g., 100 $\mu$m) and L is the length of the via. The conductive traces, such as conductive trace 1182, have a surface area of 2 dL. Therefore, the resistance of a via at RF frequencies is approximately $\pi/2$ less than the resistance of a conductive trace 1182.

Figure 13:
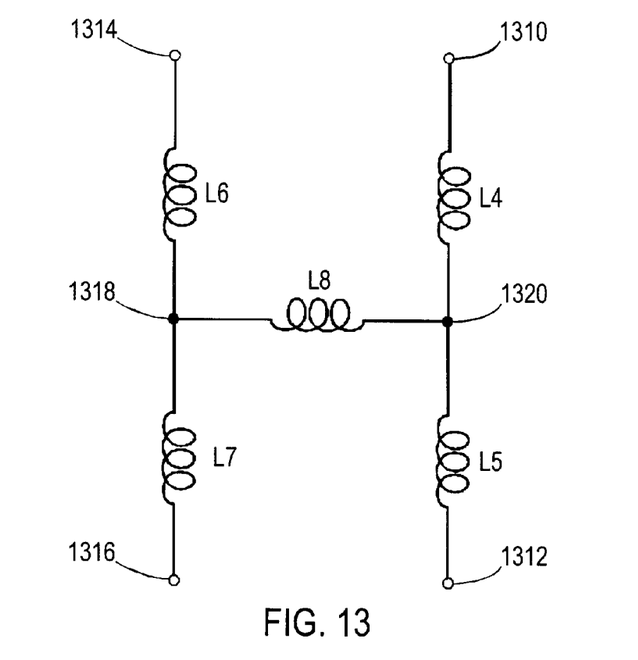
FIG. 13 is an electrical schematic diagram of inductors connected between four connection points.
Figure 14:
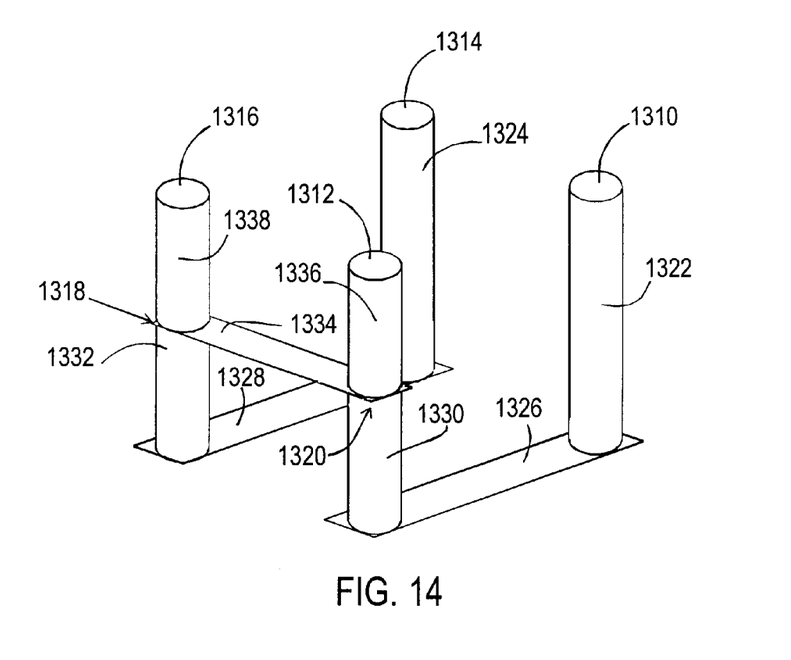
FIG. 14 is a diagram illustrating an example of how the inductors shown in FIG. 13 could be formed in a ceramic chip carrier.

FIGS. 13 and 14 illustrate one embodiment of vertically-formed inductors of the present invention. FIG. 13 is an electrical schematic diagram showing inductors L4, L5, L6, L7, and L8 connected between connection points 1310, 1312, 1314, and 1316. As shown, inductors L4 and L5 are connected between connection points 1310 and 1312. Similarly, inductors L6 and L7 are connected between connection points 1314 and 1316. Inductor L8 is connected between connection points 1318 and 1320, which are formed between inductors L6 and L7, and L4 and L5.

FIG. 14 illustrates an example of how the circuit of FIG. 13 can be implemented using vertically-formed inductors of the present invention. The connection points 1310, 1312, 1314, and 1316 are formed at the surface of the ceramic chip carrier (not shown in FIG. 14) and will be electrically connected to four of the bumps 974 of the flip-chip 970. In this example, the inductors are formed using the upper two layers of the ceramic chip carrier. Vias 1322 and 1324 extend through both layers where they are connected to an end of conductive traces 1326 and 1328, respectively, formed in the lower layer of the ceramic chip carrier. The opposite ends of the conductive traces 1326 and 1328 are connected to vias 1330 and 1332, respectively, which are also formed in the lower layer of the ceramic chip carrier. Together, the via 1322, conductive trace 1326, and via 1330 form inductor L4. Similarly, the via 1324, conductive trace 1328, and via 1332 form inductor L6. The vias 1330 and 1332 are connected to opposite ends of conductive trace 1334, formed in the upper layer. The conductive trace 1334 forms the inductor L8. Finally, vias 1336 and 1338 are connected to the vias 1330 and 1332, respectively, as well as to opposite ends of the conductive trace 1334. The vias 1336 and 1338 form the inductors L5 and L7, respectively. While FIGS. 13 and 14 show one specific example of how inductors could be formed in the ceramic chip carrier, it should be understood that other implementations are possible.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A voltage regulator for providing a regulated voltage to a device residing on an integrated circuit, the voltage regulator comprising:

a first voltage regulator coupled between a voltage source and the power amplifier, the first voltage regulator residing on the integrated circuit;

a second voltage regulator coupled between the voltage source and the power amplifier, the second voltage regulator residing on the integrated circuit; and an external resistor coupled between the second voltage regulator and the voltage source for dissipating power outside the integrated circuit.

2. The voltage regulator of claim 1, wherein the device is a power amplifier.

3. The voltage regulator of claim 1, further comprising control circuitry coupled to provide control signals to the first and second voltage regulators.

4. The voltage regulator of claim 3, wherein a control signal to the second voltage regulator controls whether power is dissipated through the external resistor.

5. The voltage regulator of claim 1, wherein the first and second voltage regulators each include a switching device.

6. The voltage regulator of claim 1, further comprising:

a third voltage regulator coupled between the voltage source and the power amplifier, the third voltage regulator residing on the integrated circuit; and a second external resistor coupled between the third voltage regulator and the voltage source for dissipating power outside the integrated circuit.

7. The voltage regulator of claim 6, further comprising a plurality of control signals for controlling the first, second, and third voltage regulators.

8. A voltage regulator for providing a regulated voltage to an integrated circuit on which the voltage regulator resides, the voltage regulator comprising:

a first regulator circuit coupled to a voltage source;

a second regulator circuit coupled to the voltage source; and an external resistor coupled to the second regulator circuit for dissipating power outside the integrated circuit.

9. The voltage regulator of claim 8, further comprising control circuitry for controlling the amount of power dissipated through the external resistor.

10. The voltage regulator of claim 9, wherein the control circuitry selectively enables the first and second regulator circuits to control the amount of power dissipated through the external resistor.

11. The voltage regulator of claim 8, further comprising a third regulator circuit coupled to the voltage source, and further comprising a second external resistor coupled to the third regulator circuit for dissipating power outside the integrated circuit.

12. The voltage regulator of claim 8, further comprising a plurality of external resistors coupled to the regulator circuits for dissipating power outside the integrated circuit.

13. A method of providing a regulated a voltage from a voltage source comprising the steps of:

providing a first voltage regulator circuit coupled to the voltage source;

providing a second voltage regulator circuit coupled to the voltage source; and connecting a resistance between the second voltage regulator circuit and the voltage source.

14. The method of claim 13, wherein the first and second voltage regulator circuits are provided on an integrated circuit, and wherein the resistance is external to the integrated circuit.

15. The method of claim 13, wherein each of the voltage regulator circuits includes a switching device.

16. The method of claim 15, further comprising the step of controlling the operation of the switching devices.

17. The method of claim 13, further comprising the step of providing control signals to the first and second regulator circuits.

18. The method of claim 17, wherein the control signals determine whether power is dissipated through the resistance.

19. The method of claim 13, further comprising the step of providing the regulated voltage to a device.

20. The method of claim 19, wherein the device is a power amplifier.

21. The method of claim 13, further comprising the steps of:

providing a third voltage regulator circuit coupled to the voltage source; and connecting a second resistance between the third voltage regulator circuit and the voltage source.

22. The voltage regulator of claim 1, wherein the first and second voltage regulators are each comprised of a switching device and an op amp.

23. The voltage regulator of claim 22, wherein the switching devices of the first and second voltage regulators are controlled independently.

* * * * *